United States Patent [19]

Takei et al.

[11] 3,979,768
[45] *Sept. 7, 1976

[54] SEMICONDUCTOR ELEMENT HAVING SURFACE COATING COMPRISING SILICON NITRIDE AND SILICON OXIDE FILMS

[75] Inventors: Ichiro Takei, Kodaira; Katsuyoshi Sasaki, Fujisawa; Sumio Nishida, Kodaira, all of Japan

[73] Assignee: Hitachi, Ltd., Japan

[ * ] Notice: The portion of the term of this patent subsequent to Dec. 16, 1986, has been disclaimed.

[22] Filed: Mar. 17, 1967

[21] Appl. No.: 623,903

[30] Foreign Application Priority Data
Mar. 23, 1966 Japan............................. 41-17415

[52] U.S. Cl.................................... 357/54; 357/52
[51] Int. Cl.².......................................... H01L 29/34
[58] Field of Search........... 317/234, 235, 234 (46), 317/234 (48.7), 234 (22), 101 A

[56] References Cited
UNITED STATES PATENTS

| | | | |
|---|---|---|---|
| 3,165,430 | 1/1965 | Hugle | 317/235 X |
| 3,189,973 | 6/1965 | Edwards et al. | 317/235 X |
| 3,326,729 | 6/1967 | Sigler | 317/235 X |
| 3,374,407 | 3/1968 | Olmstead | 317/235 |
| 3,385,729 | 5/1968 | Karchian | 317/235 X |
| 3,398,335 | 8/1968 | Dill, Jr. | 317/235 |
| 3,408,238 | 10/1968 | Sanders | 317/235 |
| 3,438,873 | 4/1969 | Schmidt | 317/235 |
| 3,463,974 | 8/1969 | Kelly et al. | 317/235 |
| 3,465,209 | 9/1969 | Denning et al. | 317/235 |
| 3,477,886 | 11/1969 | Ehlenberger | 317/235 |
| 3,479,237 | 11/1969 | Bergh et al. | 317/235 |
| 3,484,313 | 12/1969 | Tauchi et al. | 317/235 |
| 3,597,667 | 8/1971 | Horn | 317/235 |

OTHER PUBLICATIONS

*IBM Tech. Discl. Bul.*, "Formation of Depletion and Enhancement Mode Field Effect Transistors" by Lehman et al., vol. 8, No. 4, Sept. 1965.
Proceedings of the IEEE, Jan. 1966, pp. 87–88; an article entitled: A New Insulated-Gate Silicon Transistor.

*Primary Examiner*—Michael J. Lynch
*Assistant Examiner*—J. Clawson
*Attorney, Agent, or Firm*—Craig & Antonelli

[57] ABSTRACT

A semiconductor element having a surface coating consisting of, for example, a silicon nitride film and a silicon oxide film covering different surface portions of a semiconductor substrate of, for example, silicon so that such surface coating can be utilized for selective diffusion of impurities such as gallium and antimony. In a semiconductor device thus formed, the surface coating acts as a satisfactory surface protective film against external atmosphere, and the backward characteristics of the PN junction can be improved because the end edge of the PN junction terminating at the substrate surface is covered with the silicon nitride film.

11 Claims, 35 Drawing Figures

SEMICONDUCTOR ELEMENT HAVING SURFACE COATING COMPRISING SILICON NITRIDE AND SILICON OXIDE FILMS

This invention relates to semiconductor elements and to a method of making the same, and more particularly to semiconductor elements having a novel surface coating thereon and to a method of making the same. This invention further relates to a method of causing selective diffusion of impurities into the semiconductor substrate by the utilization of the above surface coating.

Heretofore semiconductor devices such as diodes, transistors or semiconductor integrated circuits have been provided with a surface protective film on their semiconductor substrate surface in order to provide protection against the detrimental external influence as by moisture and dust on their electrical properties. In a silicon planar type transistor, for example, it has been a common practice to employ a silicon oxide film as the surface protective film, suitably form a hole through this silicon oxide film and cause selective diffusion of an impurity into the silicon substrate through this hole or cause deposition of a metal on the substrate surface to form an electrode thereon. However, in spite of the fact that such a semiconductor device has its surface protected by the silicon oxide film, such device has been liable to be affected by the external atmosphere with the result that deteriorations of its electrical properties and reliability have been frequently encountered. Further in a semiconductor device in which its PN junction extends to the semiconductor substrate surface below the silicon oxide film, its backward characteristics have been largely affected by the properties of the silicon oxide film with the result that it has sometimes been impossible to obtain satisfactory electrical properties. Further in making a semiconductor device of this type, the silicon oxide film is commonly employed as a diffusion mask so that an impurity can be selectively diffused into the semiconductor substrate. However, with the silicon oxide film it has been impossible to cause selective diffusion of gallium because the silicon oxide film has or offers no masking action with respect to gallium, and therefore boron had to be employed as an impurity where it is required to selectively form a P-type semiconductor region in the semiconductor substrate. In view of the nature of these impurities, however, boron is only usable to treat ten to thirty semiconductor wafers at most in one diffusion treatment step, whereas gallium is usable to treat about one hundred semiconductor wafers at a time in one diffusion treatment step. For the above reason, there has been an ever-increasing demand for the development of a technique for the selective diffusion of gallium in order to realize the mass production of semiconductor devices of the kind described.

The present invention contemplates to eliminate the above and other defects involved in prior semiconductor devices as described above and to provide new and improved semiconductor devices which satisfy the above demand.

It is the primary object of the present invention to provide a semiconductor element having a novel surface coating.

Another object of the invention is to provide a method of making such a semiconductor element.

Still another object of the invention is to provide a method of mass producing semiconductor devices.

A further object of the invention is to provide a mask satisfactorily usable in selectively diffusing an impurity into a semiconductor substrate.

A still further object of the invention is to provide a method of selectively diffusing gallium into a semiconductor substrate.

Various objects as described above can be attained by the present invention as will be described below.

The novel surface coating provided on the surface of semiconductor devices in accordance with the present invention comprises a combination of a silicon oxide film and a silicon nitride film.

According to one embodiment of the invention, the surface coating may comprise a silicon oxide film provided on at least a portion of the semiconductor substrate surface and a silicon nitride film provided on at least a portion of that part of the semiconductor substrate surface on which the above silicon oxide film is not provided.

According to another embodiment of the invention, the above surface coating may comprise a silicon oxide film provided on the semiconductor substrate surface and a silicon nitride film selectively disposed on the silicon oxide film. By disposing the silicon nitride film on the semiconductor substrate surface with the silicon oxide film interposed therebetween, it is possible to reduce the mechanical distortion due to the difference between thermal expansion coefficients of the semiconductor substrate and the silicon nitride film.

In an experiment with a semiconductor device having in its semiconductor substrate a PN junction extending to the semiconductor substrate surface, it was possible to obtain satisfactory electrical properties by covering this PN junction with the above surface coating according to the invention. For instance, it was possible to improve the electrical properties, especially the backward characteristics of the PN junction exposed to the semiconductor substrate surface by covering this PN junction with a silicon nitride film or by covering this PN junction with a silicon oxide film and then providing a silicon nitride film on this silicon oxide film.

It was further found that the surface coating according to the present invention was very effective for use as a mask for impurity diffusion. In other words, it was found that the silicon nitride film in the surface coating according to the invention has a masking action for the diffusion of gallium and various other impurities. It was possible to cause selective diffusion of gallium into the semiconductor substrate by using this silicon nitride film as a mask during gallium diffusion.

On the other hand, according to the invention, a hole may be formed through the silicon oxide film which is more easily etched than the silicon nitride film in the surface coating and this hole may be utilized for the selective diffusion of an impurity into the substrate or for deposition of a metal for forming an electrode.

Further it is possible to very easily make various semiconductor devices by suitably employing the above techniques, that is, by a suitable combination of the selective diffusion technique by the use of the silicon nitride film, the selective diffusion technique by use of the silicon oxide film and the electrode forming or deposition technique.

The foregoing and other objects and features of the invention will become more readily apparent from the following detailed description of preferred embodiments of the present invention when taken in conjunction with the appended drawings; in which.

In a conventional planar type transistor, a silicon oxide film is used as a mask and an acceptor impurity and a donor inpurity are alternately diffused into a silicon substrate to form therein a base layer and an emitter layer. The planar type transistor is featured by the fact that, even though the silicon oxide film used as the diffusion mask is partly removed in an intermediate step, the silicon oxide film is finally left on the substrate surface to cover the emitter junction and collector junction for protecting these junctions from the external atmosphere.

Figure 1A:
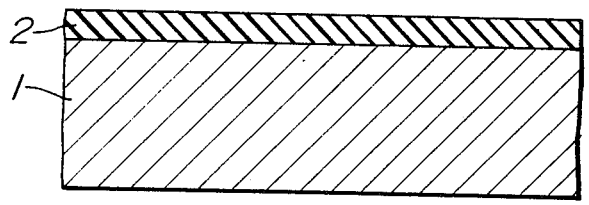
FIGS. 1a to 1d are vertical sectional views showing prior manufacturing steps for a planar type transistor.
Figure 1B:
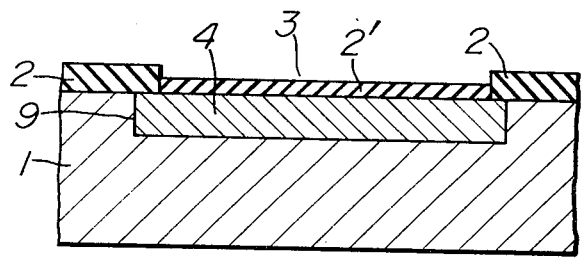
Figure 1C:
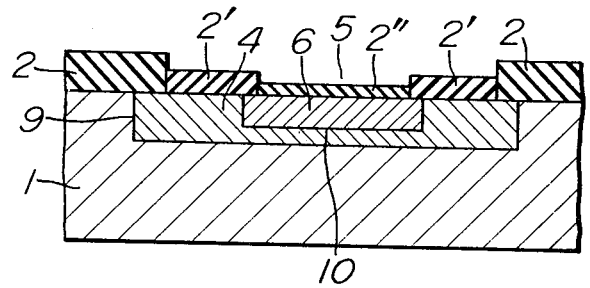
Figure 1D:
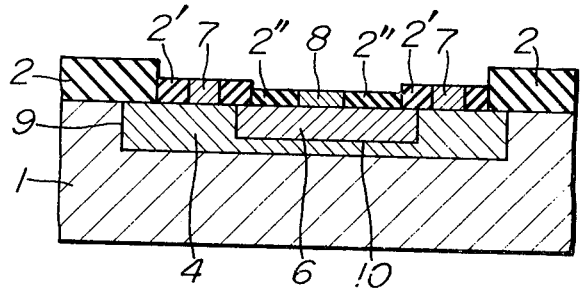

At first, a method of making such conventional planar type transistor will be described with reference to FIGS. 1a to 1d. As shown in FIG. 1a, an N-type silicon substrate 1 is first prepared. After a cleaning treatment on the surface of the substrate 1, the silicon substrate 1 is heated in an oxidizing atmosphere to form a silicon oxide film 2 on the surface thereof. The photo engraving technique is then applied to selectively remove a desired portion of the silicon oxide film 2 to form a hole 3 therethrough and to expose that portion of the substrate 1 as shown in FIG. 1b. An acceptor impurity, boron, is caused to diffuse through the exposed substrate surface to form a P-type base layer 4 in the substrate 1. During this diffusion treatment, a fresh silicon oxide film 2' is again formed on the exposed substrate surface. Then as shown in FIG. 1c, a desired portion of the newly formed silicon oxide film 2' is again removed to form a hole 5 and to expose that portion of the substrate surface. A donor impurity, for example, phosphorus is caused to diffuse through the exposed substrate surface into the substrate to form an N-type emitter layer 6. As in the case of the above-described base diffusion treatment, a fresh silicon oxide film 2" is formed on the substrate surface during this emitter diffusion treatment. Thus, operating regions of an NPN transistor are completed. Subsequently, holes are formed through the silicon oxide films on the respective operating regions and aluminum electrodes 7 and 8 are deposited through these holes as shown in FIG. 1d. In the planar type transistor made in this manner, the silicon oxide films 2, 2' and 2" are left in their disposed state on the substrate surface and cover the PN junctions, that is, the emitter junction 10 and the collector junction 9 extending to the substrate surface. However, such planar type transistors commonly exhibit poor reliability, and deterioration of the electrical properties of the backbiased collector junction 9 frequently takes place. Occurrence of such a phenomenon is presently considered to be attributable to the fact that metal ions penetrate into the silicon oxide film during the step of impurity diffusion or the step of electrode metal deposition or other treatment steps and that these metal ions affect the surface state of the semiconductor substrate surface beneath the silicon oxide film.

The present invention provides a semiconductor element having a novel surface coating free from the various prior defects as described above and a method of making such semiconductor element. Various embodiments of the present invention will be described in detail hereunder.

Figure 2:
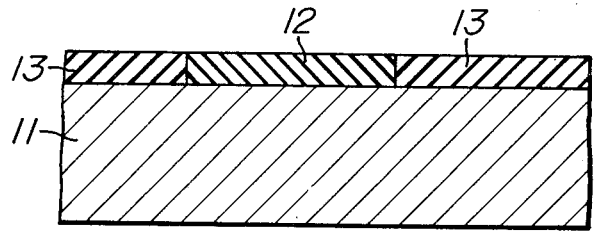
FIGS. 2 and 3 are vertical sectional views each showing one form of a semiconductor element having a surface coating according to the invention.

FIG. 2 is a vertical sectional view showing one form of a semiconductor element having the surface coating according to the invention. According to this embodiment, the semiconductor element of the invention is characterized by having a surface coating comprising a silicon oxide film 12 covering at least a portion of the surface of a semiconductor substrate 11 and a silicon nitride film 13 covering at least a portion of the remaining substrate surface.

Figure 3:
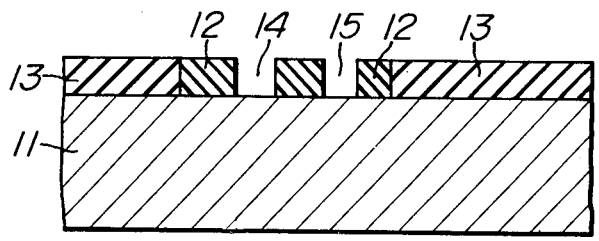

In the semiconductor element having the surface coating of the invention as described above, suitable holes 14 and 15 may be formed through the silicon oxide film 12 as, for example, shown in FIG. 3, and an impurity may be selectively diffused through these holes into the semiconductor substrate 11 or metal electrodes may be deposited therethrough to make a desired semiconductor device.

The surface coating of the structure as shown in FIG. 2 may, for example, be obtained by pre-forming a silicon oxide film 12 on at least a portion of the surface of a semiconductor substrate 11 and heating this semiconductor substrate 11 in a nitrogenous atmosphere to have a silicon nitride film 13 formed on the exposed semiconductor substrate surface. Alternatively, the surface coating as shown in FIG. 2 may, for example, be obtained by pre-forming a silicon oxide film 12 on at least a portion of the surface of a semiconductor substrate 11 and causing a nitride such, for example, as ammonia ($NH_3$) or hydrazine ($N_2H_4$) to react with a silicon compound such as, for example, silane ($SiH_4$) for thereby causing deposition of a silicon nitride film 13 on the surface of the semiconductor substrate 11 from the vapor phase.

Figure 4:
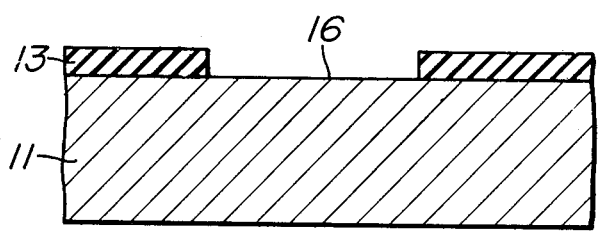
FIGS. 4 and 5 are vertical sectional views of semiconductor elements for illustrating the steps for manufacturing them according to the invention.
Figure 5:
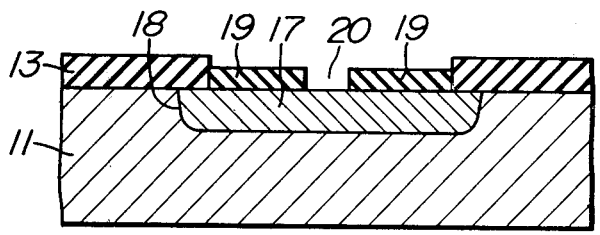

Further, a semiconductor device having the surface coating according to the invention may be made by providing a silicon nitride film 13 on the surface of a semiconductor substrate 11 in such a manner as to leave exposed at least a portion 16 of the semiconductor substrate surface as shown in FIG. 4, causing an impurity to diffuse through the exposed surface 16 by utilizing the silicon nitride film 13 as a mask, and simultaneously forming a thin silicon oxide film 19 on the exposed surface 16 as shown in FIG. 5. And further, as shown in FIG. 5, a hole 20 may be formed in the silicon oxide film 19 to diffuse another impurity into the substrate or deposit an electrode metal through the hole 20.

Figure 6:
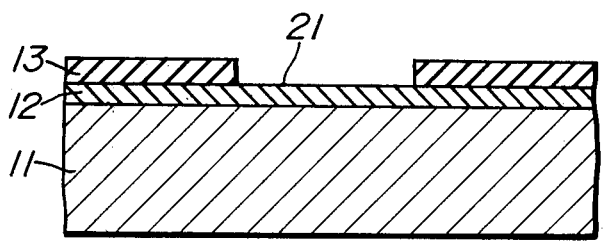
FIGS. 6 and 7 are vertical sectional views showing other forms of semiconductor elements having surface coatings according to the invention.

FIG. 6 is a vertical sectional view of another form of a semiconductor element having the surface coating according to the invention. According to this embodiment, the surface coating of the invention comprises a silicon oxide film 12 provided on the surface of a semiconductor substrate 11 and a silicon nitride film 13 provided on a portion of the silicon oxide film 12.

Figure 7:
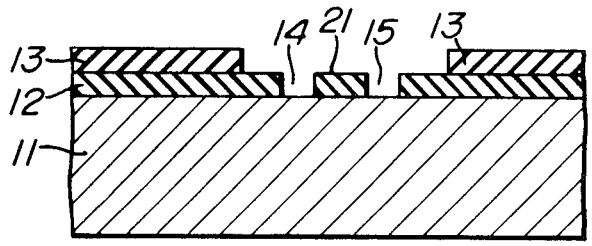

It is possible to obtain a desired semiconductor device from the semiconductor element having the surface coating as shown in FIG. 6 by forming holes 14 and 15 through that portion 21 of the silicon oxide film 12 which is not covered with the silicon nitride film 13 as shown in FIG. 7 and causing an impurity to selectively diffuse into the substrate or depositing an electrode metal through these holes.

Figure 8:
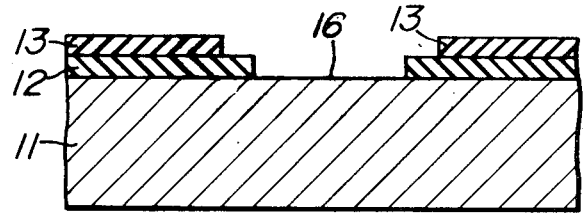
FIGS. 8 and 9 are vertical sectional views of semiconductor elements for illustrating the steps for manufacturing them according to the invention.
Figure 9:
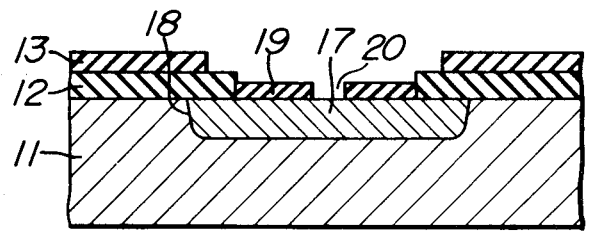

Further, as shown in FIG. 8 and FIG. 9, a semiconductor device having the surface coating according to the invention may be made by removing the greater portion of that part of the silicon oxide film 12 in the surface coating of FIG. 6 which is not covered with the silicon nitride film 13, causing an impurity to diffuse into the subtrate 11, and simultaneously forming a thin silicon oxide film 19 on the exposed semiconductor surface 16. And further, a hole 20 may be formed in the silicon oxide film 19 to cause another impurity to diffuse or to deposit an electrode metal through that hole.

Some embodiments for causing selective diffusion of gallium into a semiconductor substrate by the use of the surface coating according to the present invention will next be described.

Figure 10:
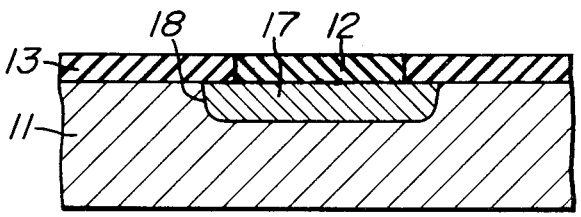
FIGS. 10 and 11 are vertical sectional views of the semiconductor elements shown in FIGS. 2 and 6 into which gallium is diffused, respectively.
Figure 11:
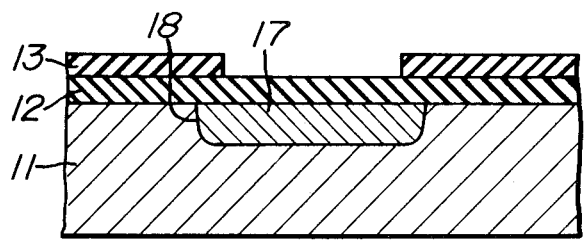

The present invention is based on the finding that a silicon nitride film has a masking action for gallium although a silicon oxide film exhibits no masking action for gallium. On the basis of the above finding, the semiconductor substrate having the surface coating of the invention as, for example, shown in FIG. 2 or 6 may be exposed to a gallium-rich atmosphere so that gallium can penetrate through the silicon oxide film 12 into the semiconductor substrate 11 to form a diffused layer 17 as shown in FIGS. 10 and 11, respectively. In case the semiconductor substrate 11 comprises an N-type semiconductor, a PN junction 18 is formed in the semiconductor substrate by this gallium diffusion treatment and the end edge of this PN junction 18 is covered with the silicon nitride film 13 as will be seen in both FIGS. 10 and 11.

Gallium and another impurity can be simultaneously diffused into the semiconductor substrate in case of a semiconductor element as, for example, shown in FIG. 3 or 7 in which holes are formed through the silicon oxide film on the semiconductor substrate surface. In this case, the latter impurity is selectively diffused through the openings 14 and 15, while gallium is simultaneously diffused into the substrate with the silicon nitride film 13 acting as a mask. Therefore, when the substrate 11 comprises an N-type semiconductor, for example, gallium and arsenic or gallium and antimony may be simultaneously diffused to obtain an NPN transistor in a single manufacturing step.

Manufacturing processes for the actual manufacture of semiconductor devices such as diodes or transistors according to the present invention will be described in detail.

EXAMPLE 1

Figure 12A:
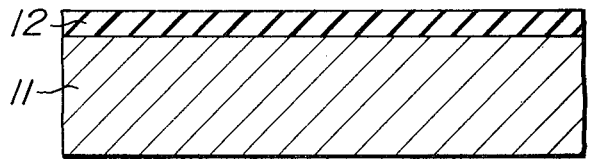
FIGS. 12a to 12f are vertical sectional views of semiconductor devices illustrating the steps of a method for manufacturing them according to the invention.
Figure 12B:
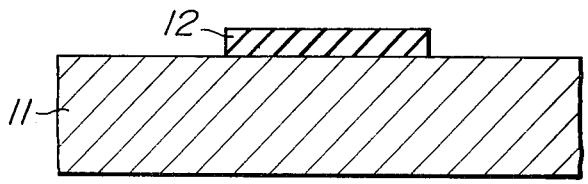
Figure 12C:
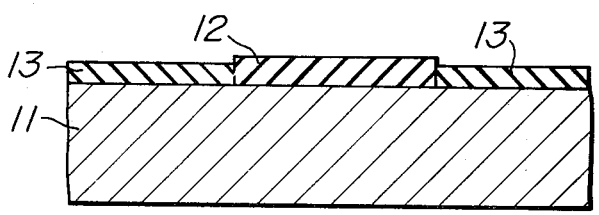

A single-crystalline substrate 11 of P-type silicon about 200 $\mu$ thick as shown in FIG. 12a is first prepared. After cleaning treatment on the surface of the subtrate 11, a silicon oxide film 12 about 5,000 A to 10,000 A thick is formed on the substrate surface. The silicon oxide film 12 on the silicon substrate 11 may be formed by heating this substrate to a temperature above 1,000°C. in an oxidizing atmosphere for thereby causing thermal growth of the silicon oxide film 12 from the silicon substrate surface, or by causing thermal decomposition of and organo-oxy-silane at a relatively low temperature of 700°C. to 800°C. for thereby causing deposition of the silicon oxide film 12 on the silicon substrate 11 from the vapor phase. In either case, the thickness of the silicon oxide film 12 can be suitably controlled by suitably controlling the duration of heat treatment. The conventional photo engraving technique is then applied for removing unnecessary portions of the silicon oxide film 12 by treating it with a liquid such, for example, as hydrofluoric acid to leave the silicon oxide film 12 on at least a portion of the surface of the silicon substrate 11 as shown in FIG. 12b. A silicon nitride film 13 about 200 A to 2,000 A thick is then formed on that part of the surface of the silicon substrate 11 which is not covered with the above silicon oxide film 12 as shown in FIG. 12c. The silicon nitride film 13 may, for example, be formed by exposing the silicon substrate shown in FIG. 12b to a nitrogen gas atmosphere and subjecting it to heat treatment at about 1,250°C. for about 30 minutes to 1 hour. Alternatively, the silicon nitride film 13 may be formed by employing hydrogen gas as a carrier gas, mixing a nitride such, for example, as ammonia ($NH_3$) or hydrazine ($N_2H_4$) with a silicon compound such, for example, as silane ($SiH_4$), entrained on the carrier gas, and causing a reaction therebetween at a temperature of about 900°C. to 1,250°C. for thereby causing deposition of the silicon nitride film 13 on the silicon substrate 11 from the vapor phase.

Figure 12D:
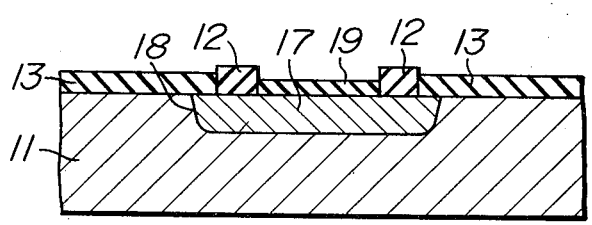
Figure 12E:
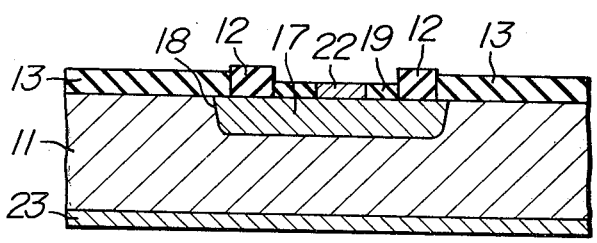

The conventional photo engraving technique is then applied again to remove a portion of the silicon oxide film 12 to thereby expose that portion of the silicon substrate 11 as shown in FIG. 12d. An impurity such, for example, as phosphorus, arsenic or antimony is caused to diffuse through this exposed surface into the substrate 11 to form an N-type diffused region 17 therein. During this diffusion treatment, a fresh silicon oxide film 19 about 1,000 A to 2,000 A thick is newly formed on the exposed silicon substrate surface. By the formation of this N-type diffused region 17, a PN junction 18 is formed between the N-type region 17 and the P-type substrate 11 and the end edge of this PN junction 18 is covered with the silicon nitride film 13. The conventional photo engraving technique is then again applied to this newly formed silicon oxide film 19 to form a small hole therethrough and an electrode metal, for example, aluminum is deposited through this hole to provide an aluminum electrode 22. An electrode metal 23 is also deposited on the bottom surface of the substrate 11 to complete a diode as shown in FIG. 12e. The electrode 22 may be formed by removing solely that portion of the silicon oxide film 19 covering the surface of the semiconductor diffused region on which the electrode is to be formed for thereby exposing that portion of the substrate, depositing a metal such as aluminum on the entire surface by the vacuum evaporation method, and then removing unnecessary aluminum by the conventional photo engraving technique.

Figure 12F:
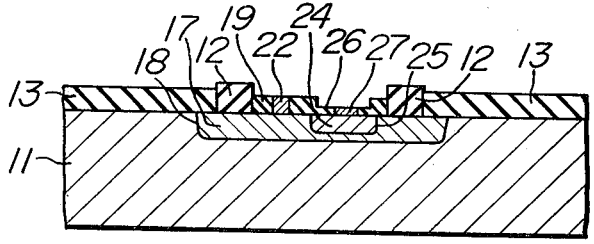

Further in FIG. 12d, a small hole may be formed through the newly formed silicon oxide film 19, and boron may be diffused through this hole into the substrate 11 to form a P-type diffused region 24 therein as shown in FIG. 12f. Then, holes extending to the P-type region 24 and the N-type region 17 may be formed through a thin silicon oxide film 26 formed during the above boron diffusing process and the silicon oxide film 19, respectively, and aluminum electrodes 27 and 22 may be deposited according to the conventional deposition method to obtain a PNP transistor.

EXAMPLE 2

The next description will be directed to a manufacturing process for the manufacture of semiconductor devices such as diodes or transistors by selectively diffusing gallium into a semiconductor substrate by the use of the surface coating according to the present invention.

Figure 13A:
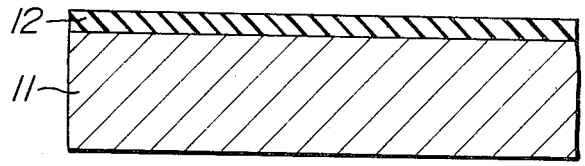
FIGS. 13a to 13e are vertical sectional views of semiconductor devices illustrating the steps of another method for manufacturing them according to the invention.
Figure 13B:
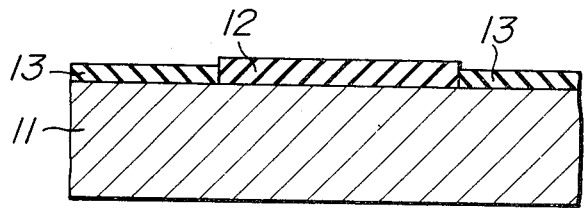
Figure 13C:
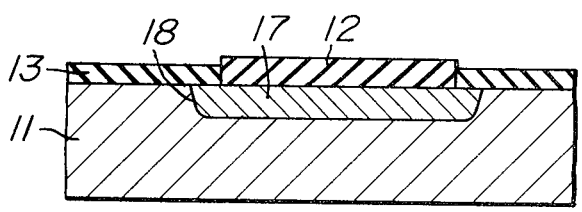
Figure 13D:
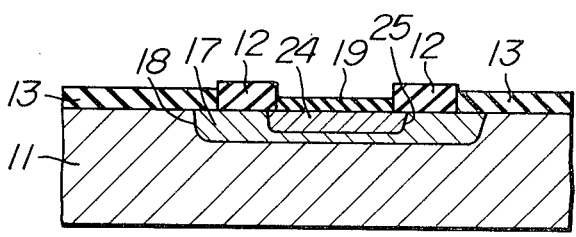
Figure 13E:
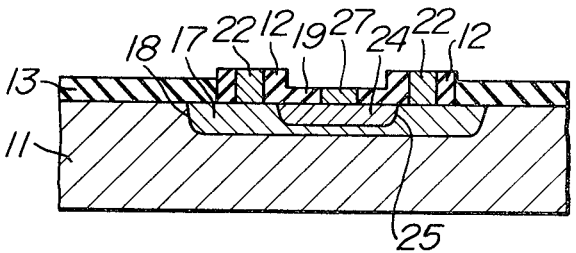

As shown in FIG. 13a, a silicon oxide film 12 about 5,000 A to 10,000 A thick is formed on the surface of a single-crystalline N-type silicon substrate 11 about 250 $\mu$ thick in the manner as described with reference to FIG. 12a. A portion of the silicon oxide film 12 is then removed in the manner as described with reference to FIG. 12b and a silicon nitride film 13 about 200 A to 2,000 A thick is formed on the exposed substrate surface as shown in FIG. 13b. This substrate 11 is then kept at a temperature of about 1,160°C. and a gallium gas at about 900°C. entrained on a carrier gas being hydrogen is made to flow over the surface of the substrate 11 to cause diffusion of gallium into the silicon substrate 11. Since the silicon nitride film 13 does not permit permeation therethrough of gallium, a P-type diffused region 17 is formed beneath the silicon oxide film 12 as shown in FIG. 13c and the end edge of a PN junction 18 between the P-type region 17 and the N-type substrate 11 is covered with the silicon nitride film 13. The conventional photo engraving technique is then applied to form a hole through a desired portion of the silicon oxide film 12 and phosphorus is diffused through that hole into the substrate 11 to form an N-type diffused region 24 therein as shown in FIG. 13d. A thin silicon oxide film 19 is newly formed as shown in FIG. 13d during the above phosphorus diffusion step. Holes extending to the N-type region 24 and the P-type region 17 thus formed in the semiconductor substrate 11 are formed through the respective silicon oxide films 19 and 12 and electrode metals 27 and 22 are deposited in these holes to obtain an NPN transistor as shown in FIG. 13e.

A diode having a region in which gallium is selectively diffused may be obtained by causing diffusion of gallium as shown in FIG. 13c, forming an electrode depositing hole through the silicon oxide film and depositing an electrode metal in this hole.

EXAMPLE 3

Referring to FIGS. 14a to 14d, a further example of the present invention will be described.

Figure 14A:
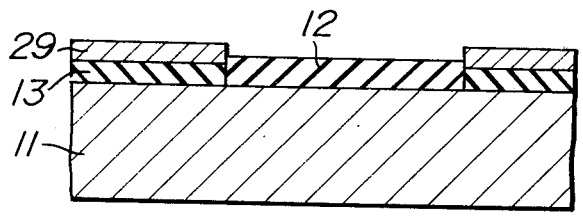
FIGS. 14a to 14d are vertical sectional views of semiconductor devices illustrating the steps of still another method for manufacturing them according to the invention.
Figure 14B:
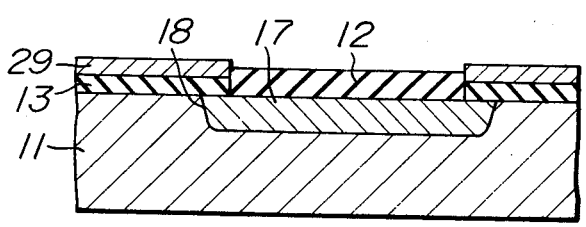

A silicon oxide film 12 is provided on at least a portion of the surface of a semiconductor substrate 11 of N-type silicon and then a silicon nitride film 13 is provided on the remaining substrate surface in the manner as described with reference to FIG. 12b. A silicon layer 29 is then deposited on a required portion of the substrate surface as shown in FIG. 14a. This silicon layer 29 may be formed on the substrate surface by the conventional vacuum evaporation method or by the vapor growth method utilizing the reduction of silicon tetrachloride (SiCl$_4$) by hydrogen and the conventional photo engraving technique is applied to remove an unnecessary portion of the silicon layer. Gallium is then diffused into the semiconductor substrate 11 with this silicon layer 29 left attached thereto so as to form a gallium diffusion layer 17 in the substrate 11 as shown in FIG. 14b.

Figure 14C:
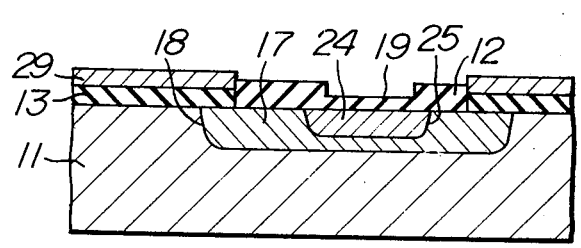

A hole is then formed through the central silicon oxide film 12 in the manner as described with reference to FIG. 13d, and an impurity such, for example, as phosphorus, arsenic or antimony is diffused through this hole to form an N-type diffused region 24 in the substrate 11 as shown in FIG. 14c. Holes are subsequently formed through desired portions of silicon oxide films 12 and 19, and electrode metals 22 and 27 are deposited in these holes to provide an NPN transistor.

Figure 14D:
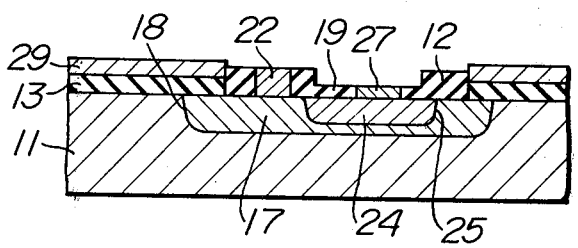

The silicon layer 29 employed in the present example may have its surface oxidized during the above diffusion treatment step, but this silicon layer 29 may be left in its existing state so that it may serve as a surface protective film for the semiconductor device in cooperation with the silicon oxide films 12, 19 and the silicon nitride film 13. If required, this silicon layer 29 may be removed after the electrode metal has been deposited as shown in FIG. 14d.

EXAMPLE 4

Figure 15A:
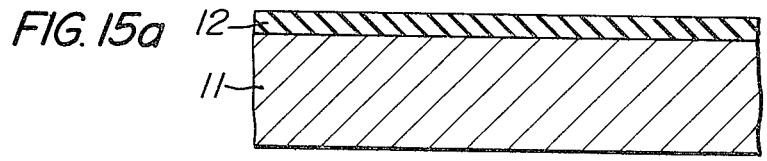
FIGS. 15a to 15f are vertical sectional views of semiconductor devices illustrating the steps of still another method for manufacturing them according to the invention.
Figure 15B:
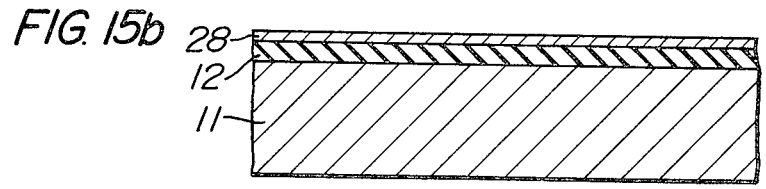

A further excellent embodiment of the present invention will next be described. As, for example, shown in FIG. 15a, a silicon oxide film 12 about 5,000 A to 10,000 A thick is formed on the surface of an N-type silicon substrate 11 about 250 $\mu$ thick. Then as shown in FIG. 15b, a silicon layer 28 about 100 A to 1,000 A thick is formed on the silicon oxide film 12. This silicon layer 28 may be formed by the conventional vacuum evaporation method or by the conventional vapor growth method utilizing the reduction of silicon tetrachloride (SiCl$_4$) by hydrogen.

Figure 15C:
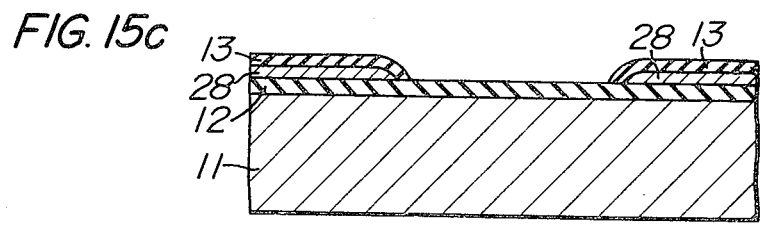
Figure 15D:
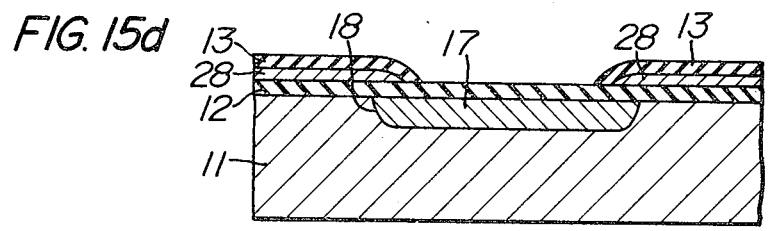

The conventional photo engraving technique is then applied to remove an unnecessary portion of the silicon layer 28. The silicon substrate 11 is subsequently subjected to heat treatment at about 1,250°C. for 30 minutes to 1 hour in a nitrogenous atmosphere to form a silicon nitride film 13 about 100 A to 500 A thick on the surface of the silicon layer 28 as shown in FIG. 15c. In lieu of heat treating the substrate in the nitrogenous atmosphere, the silicon nitride film 13 may be deposited on the silicon layer 28 by mixing silane (SiH$_4$) with ammonia (NH$_3$) to cause chemical reaction therebetween as described previously. In this case, the silicon layer 28 acts to give a strong bond between the silicon oxide film 12 and the silicon nitride film 13. Then when this silicon substrate 11 is kept at a temperature of about 1,160°C. and a gallium gas heated to 900°C. and entrained on a carrier gas being hydrogen gas is made to flow over the substrate surface, gallium diffuses through the silicon oxide film 12 into the substrate 11 to form a P-type diffused region 17 therein as shown in FIG. 15d. The end edge of a PN junction 18 formed between the P-type region 17 and the N-type substrate 11 is covered with the silicon nitride film 13 through the silicon oxide film 12 and the silicon layer 28.

Figure 15E:
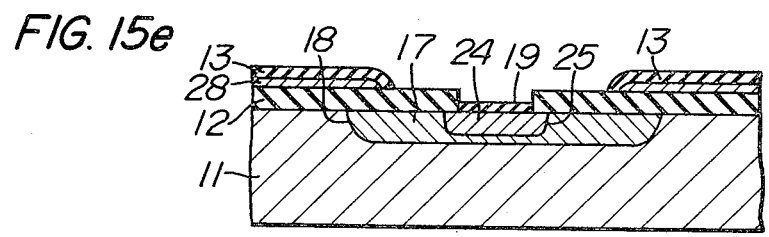
Figure 15F:
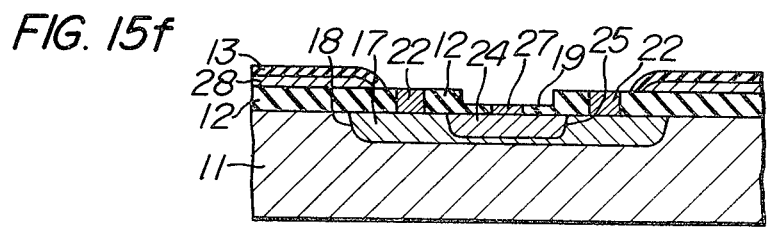

A hole is then formed through at least a portion of the part of the silicon oxide film 12 which is not covered with the silicon nitride film 13, and an N-type impurity such, for example, as phosphorus is diffused through this hole to form an N-type diffused region 24 as shown in FIG. 15e. During this diffusion step, a fresh thin silicon oxide film 19 is formed at the opening through which phosphorous is diffused. Finally, holes are formed through required portions of the silicon oxide films 12 and 19 as shown in FIG. 15f and electrode metals 22 and 27 are deposited therein to complete an NPN transistor.

From the foregoing description giving detailed explanation as to various embodiments of the present invention, it will be understood that at least a portion of the surface of a semiconductor substrate in the semiconductor device according to the invention is directly covered with a silicon nitride film or indirectly covered with such silicon nitride film through a silicon oxide film interposed therebetween and thus the surface state of the semiconductor substrate surface beneath this silicon nitride film is very stable. Such high stability is considered to be derivable from the fact that the silicon nitride film, unlike the silicon oxide film, is operative to prevent intrusion of metal ions into the film during the impurity diffusion step or the electrode metal deposition step or other treatment steps. Further, as will be apparent from FIGS. 12e, 12f, 13e, 14d and 15f, the end edge terminating at the substrate surface of the PN junction formed in the semiconductor substrate of the semiconductor device according to the invention is covered with the silicon nitride film and the outer peripheral portion of the semiconductor substrate surface is also covered with the silicon nitride film. By virtue of the above structure, there is utterly no fear that the electrical properties of the semiconductor device are affected by the external atmosphere even if the interface between the surface coating and the substrate surface might be exposed to the exterior.

According to the present invention, further, a semiconductor device can be very easily made as in the case of making conventional planar type transistors since operating regions of the semiconductor device can be easily formed by suitable working treatments on the silicon oxide film as described previously.

Although in the various embodiments of the invention described above, silicon has been solely referred to as a substrate material, it will be readily understood that germanium or other common semiconductor materials other than silicon may be equally effectively employed. Moreover although the embodiments of the present invention have solely referred to the manufacture of semiconductor devices in the form of diodes or transistors, it will be apparent that the present invention is also applicable to the manufacture of the so-called integrated circuits having such elements as resistors, capacitors, diodes or transistors formed integrally in semiconductor substrates.

Although the invention has been shown and described in terms of specific embodiments, it will be evident that changes and modifications are possible which do not in fact depart from the inventive concepts taught herein.

We claim:

1. A semiconductor device comprising a semiconductor substrate of a first conductivity type; a first insulating film consisting essentially of silicon nitride, said first insulating film being formed in contact with the major surface of said semiconductor substrate and having a first hole exposing a part of said major surface of said substrate; a diffused semiconductor region of a second conductivity type opposite to said first conductivity type formed in said major surface and forming a PN junction with said substrate, the end portion of said PN junction wholly extending to the major surface and being covered with said first insulating film; and an insulating oxide film formed in said first hole to cover said diffused semiconductor region and having a second hole exposing a part of said diffused semiconductor region.

2. A semiconductor device comprising a given conductivity semiconductor substrate, a silicon nitride layer covering a surface of said substrate, a thin semiconductor layer covering said nitride layer and spaced as well as insulated from said substrate, and an insulating oxide layer covering said thin semiconductor layer.

3. A semiconductor device comprising a semiconductor substrate of a first conductivity type having a substantially plane major surface, a semiconductor region of a second conductivity type formed in said major surface of said substrate defining a PN junction with said substrate, said PN junction terminating at said major surface, an insulating film essentially consisting of silicon oxide formed on said major surface, and a layer essentially consisting of silicon formed on said insulating film so as to completely cover the termination of said PN junction.

4. A semiconductor device comprising a semiconductor substrate of a first conductivity type having a substantially plane major surface, a semiconductor region of a second conductivity type formed in said major surface of said substrate defining a PN junction with said substrate, said PN junction terminating at said major surface, an insulating film essentially consisting of silicon nitride formed on said major surface, and a layer consisting essentially of silicon formed on said insulating film so as to completely cover the termination of said PN junction.

5. A semiconductor element comprising a semiconductor substrate having a major surface, a first surface coating consisting essentially of silicon oxide covering a portion of said major surface, and a second surface coating including a silicon nitride film also covering a portion of said major surface, said coatings respectively covering different portions of said major surface of said substrate, and in which said second surface coating further comprises a silicon oxide film covering at least a portion of said major substrate surface different from that covered with said first surface coating and a silicon layer provided on said silicon oxide film and spaced as well as insulated from said semiconductor substrate, said silicon nitride film being provided on said silicon layer.

6. A semiconductor element comprising a semiconductor substrate having a major surface, a first surface coating consisting essentially of silicon oxide covering a portion of said major surface, and a second surface coating including a silicon nitride film also covering a portion of said major surface, said coatings respectively covering different portions of said major surface of said substrate, in which said silicon nitride film covers at least a portion of said major substrate surface different from that covered with said first surface coating, said second surface coating further comprising a silicon layer provided on said silicon nitride film and spaced as well as insulated from said semiconductor substrate.

7. A semiconductor element comprising a semiconductor substrate having a substantially plane surface, a first surface coating consisting essentially of silicon oxide, and a second surface coating consisting essentially of silicon nitride, said coatings respectively covering different portions of said substantially plane surface of said substrate, and a silicon oxide film covering at least a portion of said surface different from that covered with said first surface coating and a silicon layer provided on said silicon oxide film and spaced as well as insulated from said semiconductor substrate, said second surface coating being provided on said silicon layer.

8. A semiconductor element comprising a semiconductor substrate having a substantially plane surface, a first surface coating consisting essentially of silicon oxide, and a second surface coating consisting essentially of silicon nitride, said coatings respectively covering different portions of said substantially plane surface of said substrate, said second surface coating covering at least a portion of said surface different from that covered with said first surface coating, and a silicon layer being provided on said second surface coating and spaced as well as insulated from said semiconductor substrate.

9. A semiconductor device comprising a given conductivity semiconductor substrate; a semiconductor region having a conductivity different from that of said substrate, said semiconductor region having a common major surface and contacting with said semiconductor substrate, the end portion of the interface between said semiconductor substrate and said semiconductor region wholly extending to said common major surface; a first insulating film including a silicon nitride layer covering at least the entire end portion of the interface between said semiconductor substrate and said semiconductor region, and a part of said common major surface in the vicinity of the end portion of said interface; and a second insulating film consisting essentially of silicon oxide covering at least a part of said common major surface which is not covered with said first insulating film, further comprising a diffused region formed in said semiconductor region, said diffused region having a conductivity type different from that of said semiconductor region and the end portion of the PN junction formed between said semiconductor region and said diffused region wholly extending to the common major surface and being covered with said second insulating film.

10. A semiconductor element comprising a semiconductor substrate having a substantially plane surface, a first surface coating consisting essentially of silicon oxide, and a second surface coating consisting essentially of silicon nitride, said coatings each covering respectively only different portions of said substantially plane surface of said substrate, in which said semiconductor substrate has at least one PN junction therein, the P-N-junction having its end edge terminating at said surface below said second surface coating.

11. A semiconductor element comprising a semiconductor substrate having a substantially plane surface, a first surface coating consisting essentially of silicon oxide, and a second surface coating consisting essentially of silicon nitride, said coatings each covering respectively only different portions of said substantially plane surface of said substrate, in which said semiconductor substrate has at least one diffused region formed in said surface, the greater portion of the surface of said diffused region being covered with said first surface coating, and at least one PN junction formed between said diffused region and said substrate terminating with its end at said substantially plane surface below said second surface coating.

* * * * *